(12) United States Patent
Wang et al.

(10) Patent No.: US 11,289,834 B2
(45) Date of Patent: Mar. 29, 2022

(54) CONNECTOR ASSEMBLING STRUCTURE

(71) Applicant: Quanta Computer Inc., Taoyuan (TW)

(72) Inventors: Shen-Her Wang, Taoyuan (TW);
Chun-Yun Tseng, Taoyuan (TW);
Chien-Yu Hou, Taoyuan (TW);
Yu-Chun Tsai, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 133 days.

(21) Appl. No.: 16/861,438

(22) Filed: Apr. 29, 2020

(65) Prior Publication Data

US 2021/0218166 A1 Jul. 15, 2021

(30) Foreign Application Priority Data

Jan. 9, 2020 (TW) ................................. 109100682

(51) Int. Cl.
*H01R 12/70* (2011.01)
*H05K 5/00* (2006.01)
*H01R 12/72* (2011.01)

(52) U.S. Cl.
CPC ....... *H01R 12/7005* (2013.01); *H01R 12/721* (2013.01); *H05K 5/006* (2013.01); *H05K 5/0052* (2013.01); *H05K 5/0056* (2013.01)

(58) Field of Classification Search
CPC .............. H01R 12/7005; H01R 12/721; H05K 5/0052; H05K 5/0056; H05K 5/006

USPC .......................................................... 439/64
See application file for complete search history.

(56) References Cited

U.S. PATENT DOCUMENTS 4,590,337 A * 5/1986 Engelmore ............. H04M 1/02
                                                          191/12 R
2016/0166038 A1* 6/2016 Oguchi .............. A45D 26/0009
                                                          219/223

FOREIGN PATENT DOCUMENTS

CN     207841401     *  9/2018    ................ H02J 7/00

* cited by examiner

*Primary Examiner* — Peter G Leigh
(74) *Attorney, Agent, or Firm* — McClure, Qualey & Rodack, LLP

(57) ABSTRACT

A connector assembling structure is provided. The connector assembling structure includes a shell, a circuit board, a connector, a fixing member, and an elastic member. The circuit board is disposed on the shell. The connector is disposed on the circuit board. The fixing member is fixed on the shell. The elastic member is disposed on the fixing member. The circuit board includes a pillar. The fixing member includes a fixing member opening corresponding to the pillar. The pillar passes through the fixing member opening. The size of the fixing member opening is greater than the size of the pillar, such that the circuit board and the elastic member may move relative to the fixing member through the fixing member opening.

20 Claims, 5 Drawing Sheets

CONNECTOR ASSEMBLING STRUCTURE

CROSS-REFERENCE TO RELATED APPLICATIONS

This application claims the benefit of Taiwan Patent Application No. 109100682, filed on Jan. 9, 2020, the entirety of which is incorporated by reference herein.

BACKGROUND OF THE INVENTION

Field of the Invention

The present invention relates to an assembling structure of elements, and it especially relates to a connector assembling structure.

Description of the Related Art

When manufacturing all kinds of elements, "manufacturing tolerance" may occur. As a result of this, the manufactured element is not in accordance with the specification as originally designed. In addition, when assembling a plurality of elements, "assembly tolerance" may occur, wherein the elements cannot be disposed in the predetermined positions as originally designed. A common method of assembly is fastening the elements by screw. Although the method of assembly that depends on screws has high strength, it lacks flexibility. Therefore, when assembling elements, manufacturing tolerance and assembly tolerance may cause the assembling of the elements to be unsuccessful because a deviation may be generated between the interface of the elements.

Therefore, it is rather important to correct and compensate for the manufacturing tolerance and the assembly tolerance.

BRIEF SUMMARY OF THE INVENTION

Some embodiments of this disclosure provide a connector assembling structure. The connector assembling structure includes a shell, a circuit board, a connector, a fixing member, and an elastic member. The circuit board is disposed on the shell. The connector is disposed on the circuit board. The fixing member is fixed on the shell. The elastic member is disposed on the fixing member. The circuit board includes a pillar. The fixing member includes a fixing member opening corresponding to the pillar. The pillar passes through the fixing member opening. The size of the fixing member opening is greater than the size of the pillar, such that the circuit board and the elastic member may move relative to the fixing member through the fixing member opening.

BRIEF DESCRIPTION OF THE DRAWINGS

The present invention may be more fully understood by reading the subsequent detailed description and examples with references made to the accompanying drawings.

DETAILED DESCRIPTION OF THE INVENTION

The following disclosure provides many different embodiments, or examples, for implementing different features of the provided subject matter. Specific examples of components and arrangements are described below to simplify this disclosure. These are, of course, merely examples and are not intended to be limiting. For example, the formation of a first feature "on" or "above" a second feature in the description that follows may include embodiments in which the first and second features are formed in direct contact, and may also include embodiments in which additional features may be formed between the first and second features, such that the first and second features may not be in direct contact. Ordinal terms such as "first", "second", etc., used in the description and claims do not by themselves connote any priority, precedence, or order of one element over another, but are used merely as labels to distinguish one element from another element having the same name. In addition, in different examples of this disclosure, symbols or alphabets may be used repeatedly.

Furthermore, spatially relative terms, such as "above" and the like, may be used herein for ease of description to describe one element or feature's relationship to another element or feature as illustrated in figures. The spatially relative terms are intended to encompass different orientations of the device in use or operation in addition to the orientation depicted in figures. The apparatus may be otherwise oriented (rotated 90 degrees or at other orientations) and the spatially relative descriptors used herein may likewise be interpreted accordingly.

Figure 1:
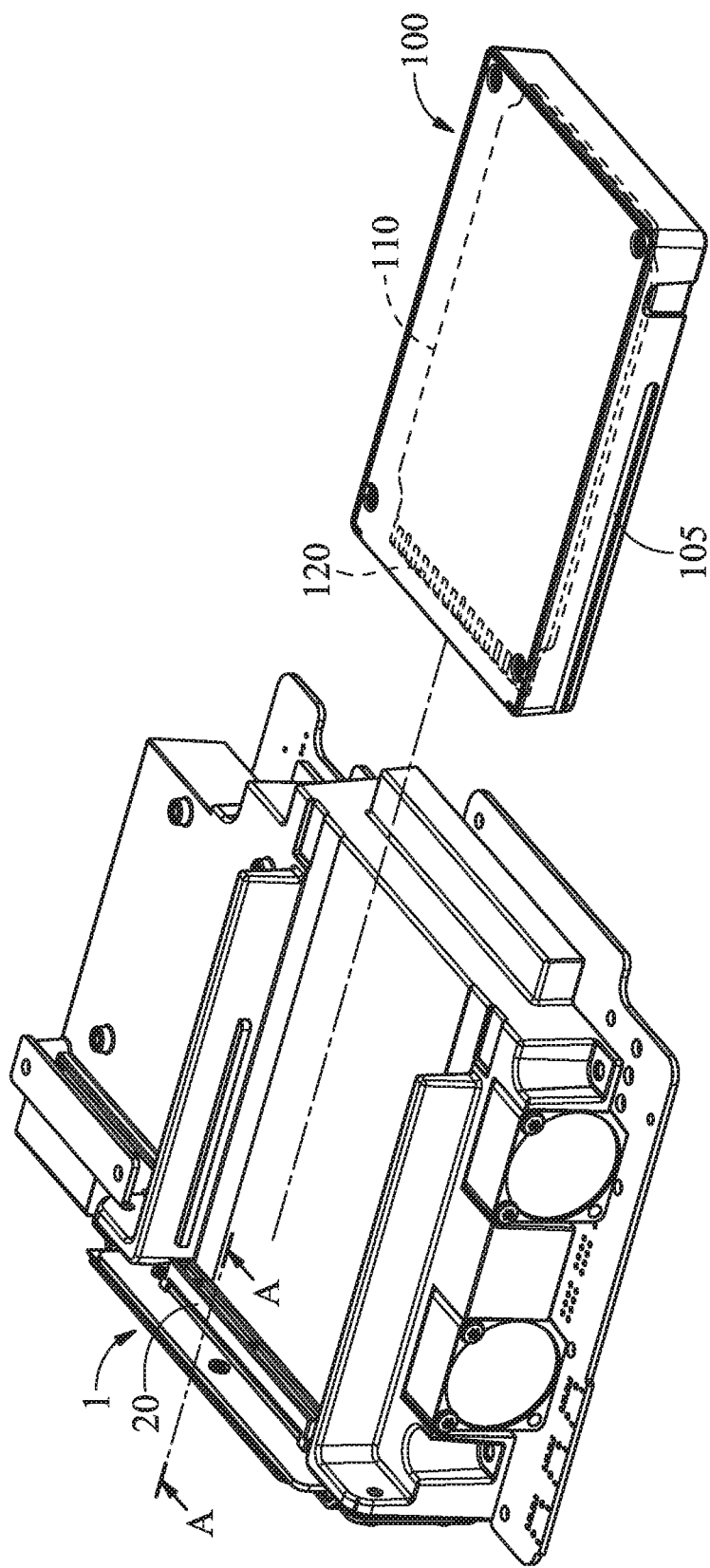
FIG. 1 is a perspective view of a connector assembling structure and an electronic device according to some embodiments.

FIG. 1 is a perspective view of a connector assembling structure 1 and an electronic device 100 according to some embodiments.

The electronic device 100 is substantially a cuboid. The electronic device 100 may be installed on the connector assembling structure 1. In some embodiments, the electronic device 100 includes a trench 105. The electronic device 100 may be an automobile device, including an automobile entertainment device, an automobile audio-visual device, an automobile control system, or the like, such as an adaptive cruise control (ACC).

A circuit board 110 is disposed in the internal space of the electronic device 100. The circuit board 110 may be a printed circuit board (PCB), a flexible printed circuit (FPC), a flexible-hard composite board, etc. The circuit board 110 normally includes an electrical connection portion 120, which is electrically connected to an element outside the circuit board 110. For example, the electrical connection portion 120 may be one or more gold finger. When the electronic device 100 is installed on the connector assembling structure 1, the circuit board 110 is engaged with the connector assembling structure 1 or electrically connected to the connector assembling structure 1. Specifically, the electrical connection portion 120 is engaged with a connector 20 of the connector assembling structure 1.

Figure 2:
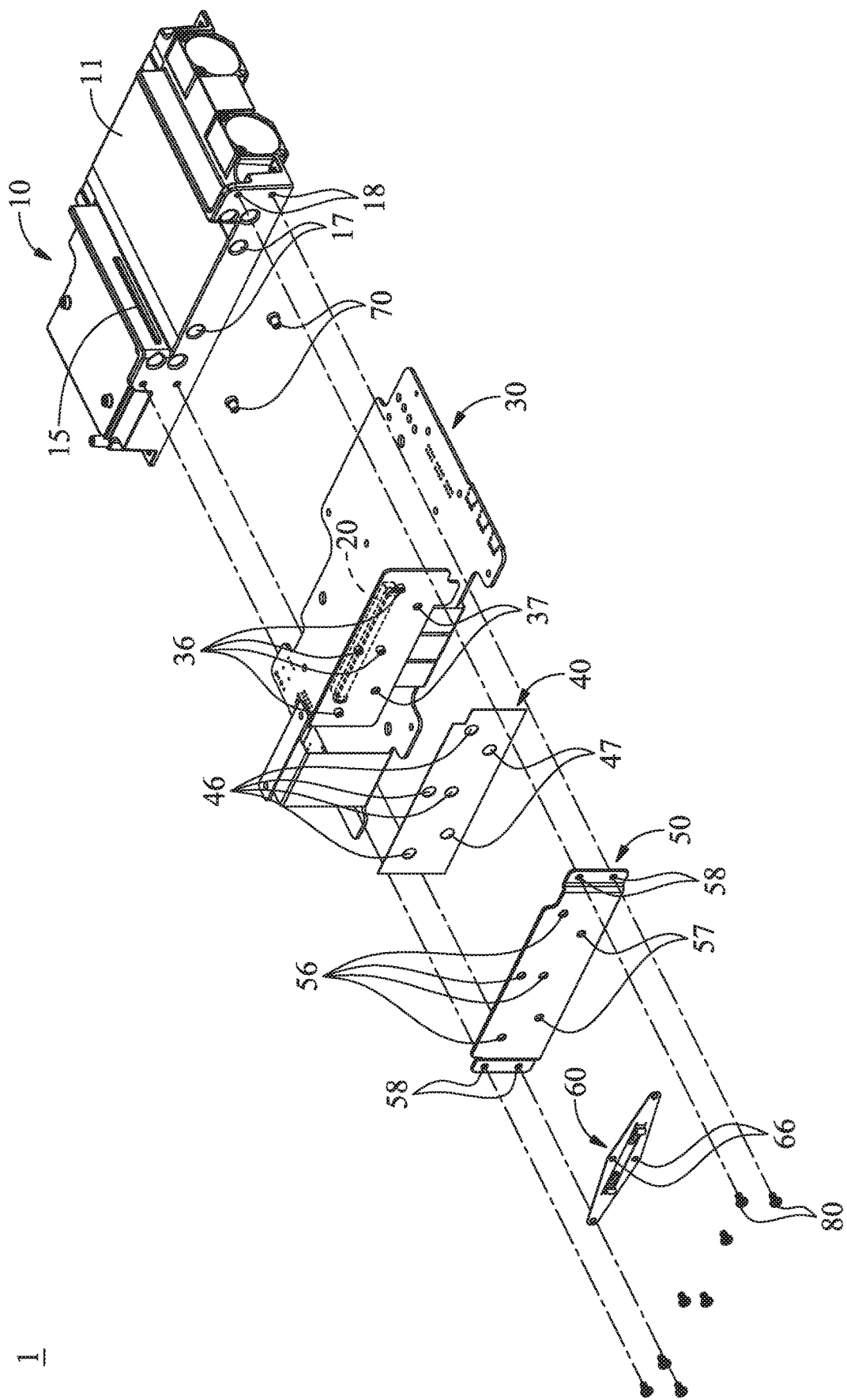
FIG. 2 is an exploded view of the connector assembling structure according to some embodiments.

FIG. 2 is an exploded view of the connector assembling structure 1 according to some embodiments. The connector assembling structure 1 includes a shell 10, a connector 20, a circuit board 30, a pad 40, a fixing member 50, and a elastic member 60.

The shell 10 includes a receiving space 11 for receiving the electronic device 100. In some embodiments, the shell 10 includes a track 15 corresponding to the trench 105 of the electronic device 100. Whenever the electronic device 100 is installed on or removed from the connector assembling structure 1, the track 15 may guide the electronic device 100, which is beneficial for positioning and moving the electronic device 100 smoothly. The shell 10 may further include two recesses 17 and a plurality of screw holes 18.

The shell 10 may have different shapes or sizes due to the environment of the connector assembling structure 1. The shell 10 may dissipate heat. Alternatively, a radiator (e.g. a cold plate) may be disposed on the connector assembling structure 1 to dissipate heat.

The connector 20 is disposed on the circuit board 30, and the connector 20 functions as a connecting element between the circuit board 110 of the electronic device 100 and the circuit board 30.

The circuit board 30 may be a rigid-flex board. The circuit board 30 is disposed on the shell 10. The circuit board 30 includes four pillars 36. The pillars 36 are made of metal, such as copper. The pillars 36 are hollow and screw structures may exist inside the pillars 36. The circuit board 30 further includes two circuit board positioning holes 37 corresponding to the recesses 17 of the shell 10.

The pad 40 is disposed between the circuit board 30 and the fixing member 50. In some embodiments, if the fixing member 50 is made of metal, then the pad 40 is made of insulating material to prevent the fixing member 50 from contacting the circuit board 30 directly and interfering with the transmission of electric signals. Additionally, the pad 40 may also reduce electromagnetic interference (EMI). In some other embodiments, if the fixing member 50 is not made of conductive material, the pad 40 may be omitted. It should be noted that the environmental temperature of the connector assembling structure 1 may be at about 60° C. to about 70° C. Therefore, the pad 40 may be made of heat-resistant material. The pad 40 includes four pad openings 46 corresponding to the four pillars 36 of the circuit board 30 and two pad positioning holes 47 corresponding to the two circuit board positioning holes 37 of the circuit board 30.

The fixing member 50 is disposed on the shell 10. The fixing member 50 is made of high-strength material, such as metal. Similar to the pad 40, the fixing member 50 includes four fixing member openings 56 corresponding to the four pillars 36 of the circuit board 30 and two fixing member positioning holes 57 corresponding to the two circuit board positioning holes 37 of the circuit board 30. Essentially, each of the fixing member positioning holes 57 is designed to be smaller than each of the fixing member openings 56 for positioning accurately.

It should be noted that the size of each of the fixing member openings 56 of the fixing member 50 is slightly larger than the size of each of the pillars 36 of the circuit board 30. Therefore, when the pillars 36 are located in the fixing member openings 56, the pillars 36 may still move slightly. In some embodiments, the fixing member openings 56 may be oblong holes (also be referred to as slotted drills or slotted holes). The actual shape of each of the fixing member openings 56 is determined by tolerance analysis to determine the space for the movement of the pillars 36. Additionally, the pre-determined space may be increased or decreased based on actual requirements. For example, a larger assembly tolerance may occur in the arrangement direction of the elements. Therefore, the size and space of each of the fixing member openings 56 in the direction that is parallel to the arrangement direction of the elements are designed to be larger than the size and space of each of the fixing member openings 56 in the direction that is perpendicular to the arrangement direction of the elements.

In addition, the fixing member 50 further includes a plurality of fixing member fixing holes 58 corresponding to the screw holes 18 of the shell 10.

The elastic member 60 is disposed on the fixing member 50. The elastic member 60 is made of elastic material and thus it may be deformable, flexible, and the like. Similar to the pad 40 and the fixing member 50, the elastic member 60 includes four elastic member openings 66 corresponding to the pillars 36 of the circuit board 30.

The connector assembling structure 1 may further include at least one positioning member 70. The at least one positioning member 70 is made of compressible material, such as rubber. The at least one positioning member 70 is disposed in the recesses 17 of the shell 10.

Generally, the connector assembling structure 1 further includes a plurality of screws 80 for connecting the elements of the connector assembling structure 1. Normally, screws are used for fixing the elements of the automobile-related devices or equipment to achieve shockproof. However, methods used for fixing the elements stably are within the scope of this disclosure.

When assembling the connector assembling structure 1, positioning of the shell 10, the circuit board 30, the pad 40, and the fixing member 50 is conducted first. The at least one positioning member 70 disposed in the recesses 17 of the shell 10 passes through one of the circuit board positioning holes 37 of the circuit board 30, one of the pad positioning holes 47 of the pad 40, and one of the fixing member positioning holes 57 of the fixing member 50 sequentially to accomplish preliminary positioning. Also, the at least one positioning member 70 may be located in the circuit board positioning holes 37 of the circuit board 30, the pad positioning holes 47 of the pad 40, and the fixing member positioning holes 57 of the fixing member 50 with a tight fit. That is, the is no space between the at least one positioning member 70 and the circuit board positioning holes 37 of the circuit board 30, the pad positioning holes 47 of the pad 40, and the fixing member positioning holes 57 of the fixing member 50.

Then, each of the pillars 36 passes through the pad openings 46 of the pad 40, the fixing member fixing member openings 56 of the fixing member 50, and the elastic member openings 66 of the elastic member 60 sequentially.

Next, each of the screws 80 passes through the fixing member fixing holes 58 of the fixing member 50 and the screw holes 18 of the shell 10 to fix the fixing member 50 to the shell 10.

Last, each of the screws 80 passes through the elastic member openings 66 of the elastic member 60, the fixing member opening 56 of the fixing member 50, and the pad openings 46 of the pad 40 sequentially. Finally, each of the screws 80 is fastened to the pillars 36 of the circuit board 30 to accomplish assembling the connector assembling structure 1.

By the method described above, the fixing member 50 is substantially fixed to the shell 10 by the screws 80 passing through the fixing member fixing holes 58. The fixing member 50 is fixed to the shell 10 and immovable relative to the shell 10. However, the fixing member openings 56 of the fixing member 50 are larger than the pillars 36 of the circuit board 30, so the circuit board 30 and the elastic member 50 may move relative to the fixing member 56 through the fixing member openings 56 of the fixing member 50. For example, when the circuit board 110 is engaged with the connector 20, with the movement of the circuit board 30 and the elastic member 60 and the deformation of the elastic member 60, both manufacturing tolerance and assembly tolerance could be compensated.

It should be noted that since the positioning member 70 is made of compressible material, the positioning member 70 is compressed and deformed while fastening the screws 80, or during the movement of the circuit board 30 and the elastic member 60. Therefore, the positioning member 70 does not affect the connector assembling structure 1.

Figure 3:
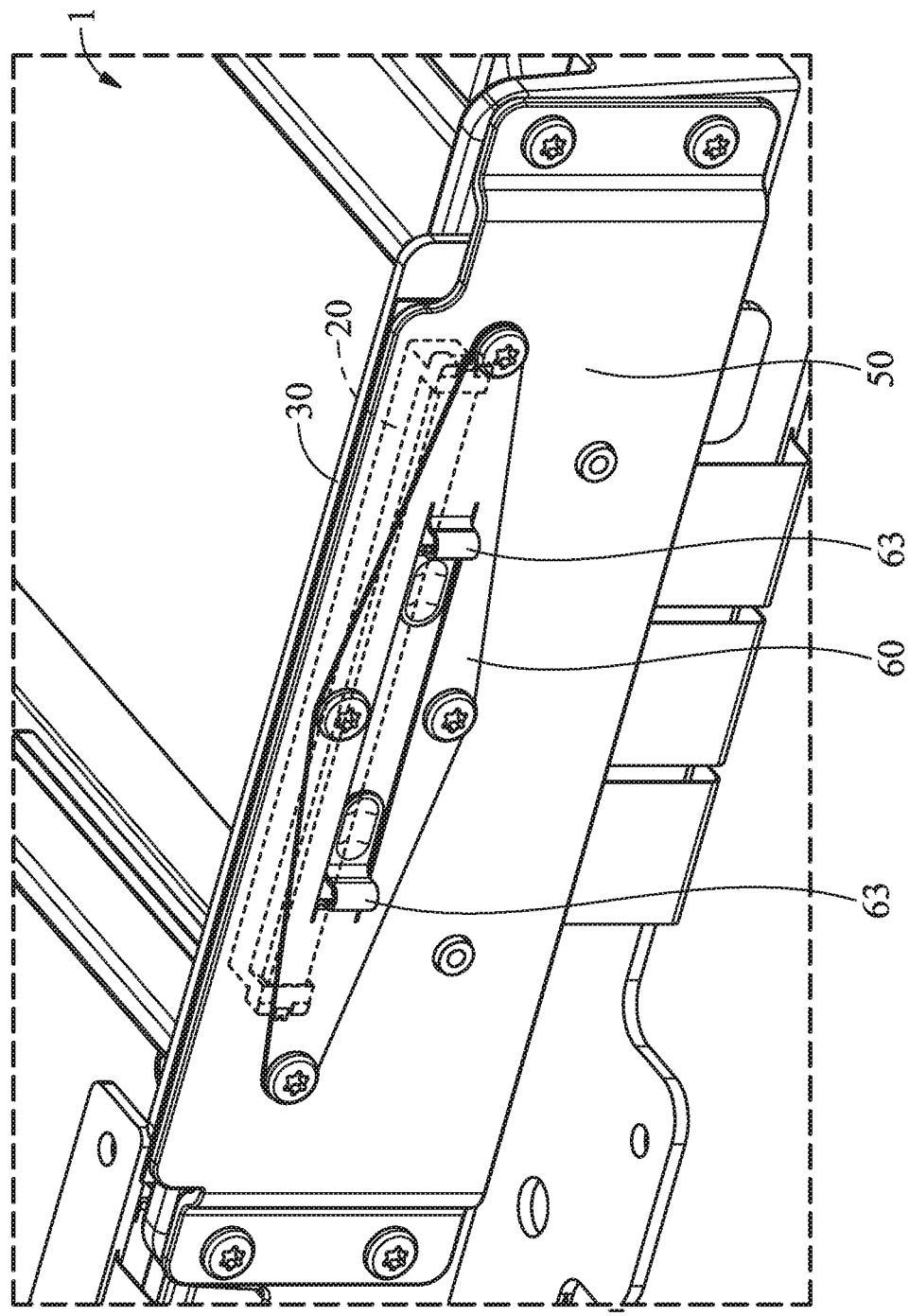
FIG. 3 is a schematic view of the connector assembling structure according to some embodiments.

FIG. 3 is a schematic view of the connector assembling structure 1 according to some embodiments, which clearly show the assembled connector assembling structure 1. Here, the position of the connector 20 is shown in dotted lines. When the circuit board 110 is inserted into or removed from the connector assembling structure 1, a certain force is required. Such force may cause the connector 20 and the circuit board 30 deform or broken after plenty of times of insertion or removal of the circuit board 110. To extend the life of the connector 20 and the circuit board 30, the fixing member 50 and the elastic member 60 of this disclosure are able to support the connector 20 and the circuit board 30.

As shown in FIG. 3, the connector 20 is disposed within the profile of the elastic member 60. Part of the aforementioned force may be absorbed by the elastic member 60, such that the elastic member 60 may protect the connector 20 effectively. It should be noted that the elastic member 60 may have different polygonal shapes, such as a rectangle. In this embodiment, the profile of the elastic member 60 is a rhombus for less useless area and reducing waste.

Furthermore, since an automobile may generate pretty large shock or impact when driven because of reasons such as bumpy roads. To prevent elements (such as the connector 20 and the circuit board 30) from breaking, the shock-proof properties of the connector assembling structure 1 have to be enhanced.

Figure 4:
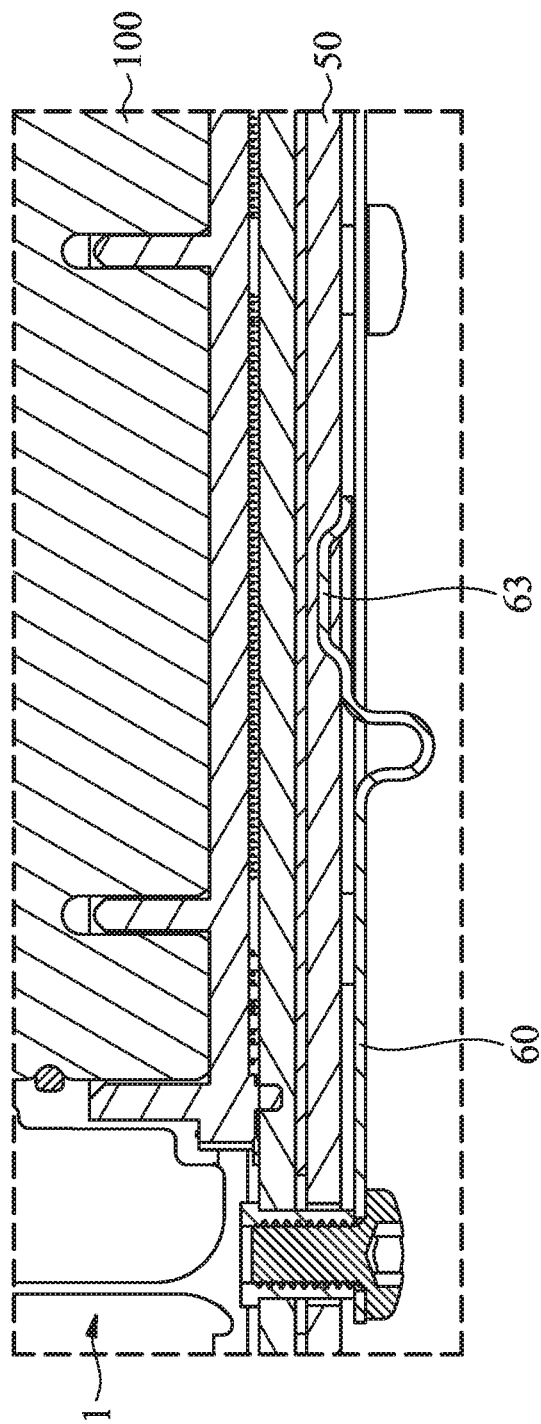
FIG. 4 is a top view of the connector assembling structure according to some embodiments.

FIG. 4 is a top view of the connector assembling structure 1 according to some embodiments. Please also refer to FIG. 3. As shown in FIG. 3 and FIG. 4, the elastic member 60 further includes two springs 63 abutting the fixing member 50. In FIG. 4, the springs 63 and the fixing member 50 are shown with an interference fit to illustrate that the springs 63 may provide a large clutch force to help fixing the fixed connector assembling structure 1. Furthermore, the shock-proof ability of the connector assembling structure 1 is enhanced.

Figure 5:
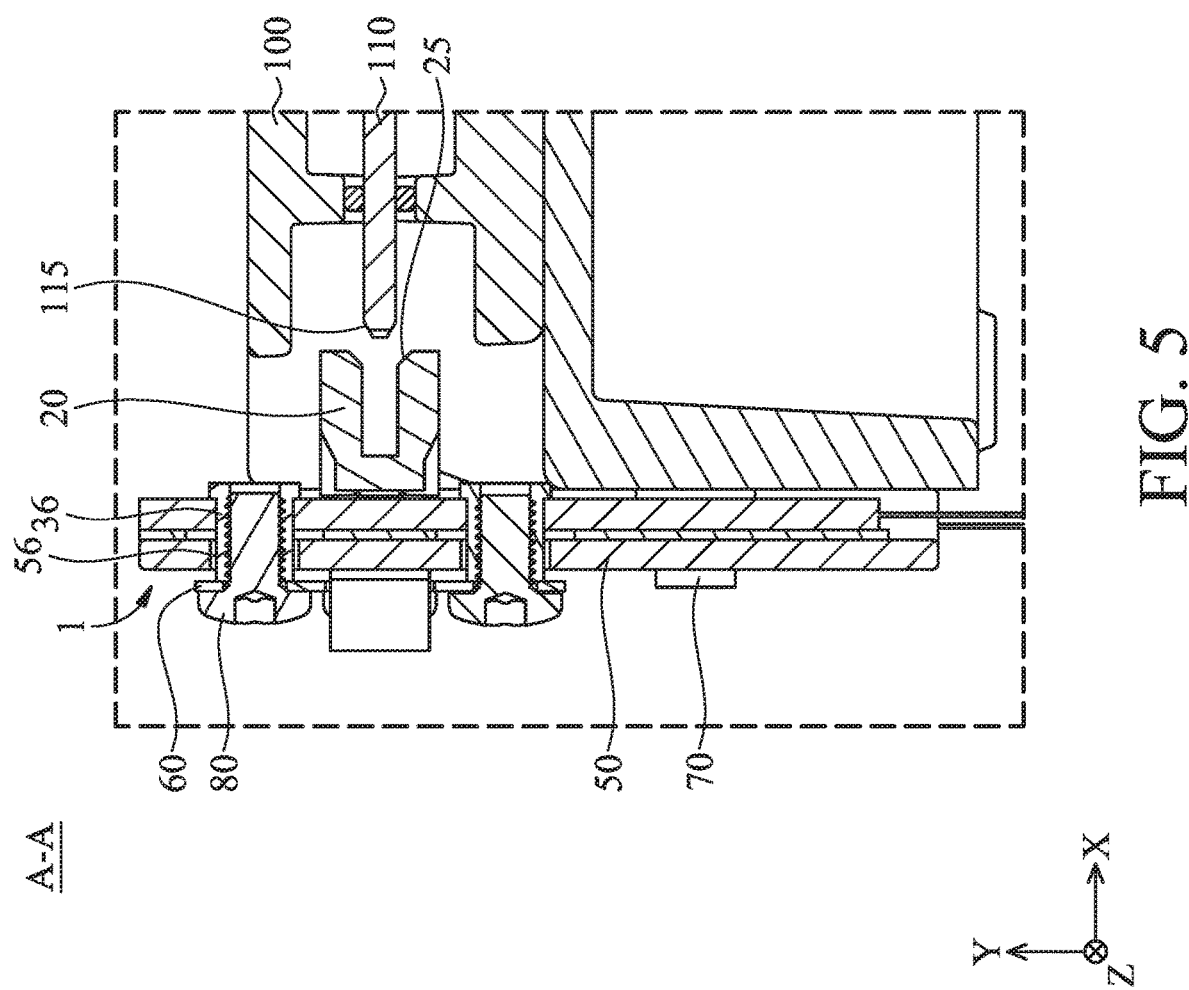
FIG. 5 is a cross-sectional view of the connector assembling structure and the electronic device viewed along line A-A in FIG. 1.

FIG. 5 is a cross-sectional view of the connector assembling structure 1 and the electronic device 100 viewed along line A-A in FIG. 1. Here, please refer to the coordinate shown in FIG. 5 to understand the directions described below. When the electronic device 100 is inserted into the connector assembling structure 1 along the X-axis, the circuit board 110 of the electronic device 100 may be engaged with the connector 20. In FIG. 5, the size of each of the fixing member openings 56 is larger than the size of each of the pillars 36 of the circuit board 30. Therefore, as described above, the fixing member 50 is fixed to the shell 10 and the fixing member 50 is immovable while the circuit board 30 and the elastic member 60 may move relative to the fixing member 50 through the fixing member openings 56 of the fixing member 50. Therefore, this disclosure provides a method for helping the circuit board 110 engaged with the connector 20 effectively and thus compensating the manufacturing tolerance and assembly tolerance. It should be noted that the movement range of the circuit board 30 and the elastic member 60 is limited to the space between the fixing member openings 56 and the pillars 36.

In addition, the connector 20 may include two inclined surfaces 25. The circuit board 110 may include two guidance inclined surfaces 115. The inclined surfaces 25 and the guidance inclined surfaces 115 may guide the circuit board 110.

For example, when the electronic device 100 is inserted into the connector assembling structure 1 along X-axis, the position of the circuit board 110 may be higher than the position where the circuit board 110 should be engaged with the connector 20, due to the influence of both of manufacturing tolerance and assembly tolerance. Meanwhile, the upper inclined surface 25 is in contact with the upper guidance inclined surface 115 and the friction force is generated. The friction force makes the connector 20 and the circuit board 30 move in opposite directions. The connector 20 and the circuit board 30 connected to the connector 20 may move in the +Y-axis due to such friction force, driving the elastic member 60 to move in the +Y-axis and let the elastic member 60 deformed. The circuit board 110 may move in −Y-axis due to such friction force. By the displacement correction described above, the circuit board 110 may be connected to the connector 20 smoothly, and vice versa.

If the position of the circuit board 110 is lower than the position where the circuit board 110 should be engaged with the connector 20 due to the influence of both of manufacturing tolerance and assembly tolerance, the lower inclined surface 25 is in contact with the lower guidance inclined surface 115 and the friction force is generated. Meanwhile, the connector 20 and the circuit board 30 connected to the connector 20 may move in −Y-axis due to such friction force, driving the elastic member 60 to move in −Y-axis and let the elastic member 60 deformed. As for the circuit board 110, it may move in the +Y-axis due to such friction force. By the displacement correction described above, the circuit board 110 may be connected to the connector 20 smoothly.

Although only the tolerance deviation of the circuit board 110 occurs in Y-axis are described, the size of each of the fixing member openings 56 of the fixing member 50 of this disclosure may be designed to be larger than the size of each of the pillars 36 of the circuit board 30 in the radial direction of the fixing member openings 56 (YZ-plane). That is, all the tolerance deviation occurs in the radial direction of the fixing member openings 56 are within the scope of this disclosure. In other words, the connector assembling structure 1 may correct and compensate for tolerance deviation of the circuit board 110 occurs in the radial direction of the fixing member openings 56.

A connector assembling structure is provided. The connector assembling structure includes a connector, a circuit board, a fixing member, and an elastic member. The fixing member openings are designed by tolerance analysis, such that the fixing member openings have special sizes and the pillars of the circuit board may move within the fixing member openings. The elastic member may improve the flexibility of assembling. Based on this disclosure, negative influences caused by manufacturing tolerance and assembly tolerance are eliminated, and thus the elements may be assembled smoothly.

The foregoing outlines features of several embodiments such that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein.

Those skilled in the art should also realize that such equivalent constructions do not depart from the spirit and scope of this disclosure, and that they may make various changes, substitutions, and alterations herein without departing from the spirit and scope of this disclosure. In addition, the scope of this disclosure is not limited to the specific embodiments described in the specification, and each claim constitutes a separate embodiment, and the combination of various claims and embodiments are within the scope of the disclosure.

What is claimed is:

1. A connector assembling structure, comprising:
a shell;
a circuit board disposed on the shell;
a connector disposed on the circuit board;
a fixing member fixed on the shell; and
an elastic member disposed on the fixing member;
wherein the circuit board comprises a pillar, the fixing member comprises a fixing member opening corresponding to the pillar, the pillar passes through the fixing member opening, and a size of the fixing member opening is greater than a size of the pillar;
wherein the connector assembling structure further comprises a positioning member disposed on the shell, wherein the fixing member comprises a fixing member positioning hole, and the positioning member passes through the fixing member positioning hole;
wherein the positioning member is made of compressible material.

2. The connector assembling structure as claimed in claim 1, wherein a size of the fixing member positioning hole is less than a size of the fixing member opening.

3. The connector assembling structure as claimed in claim 1, further comprising a pad disposed between the circuit board and the fixing member.

4. The connector assembling structure as claimed in claim 1, further comprising a screw, wherein the elastic member further comprises an elastic member opening corresponding to the pillar, and the screw passes through the elastic member opening.

5. The connector assembling structure as claimed in claim 1, further comprising a screw, wherein the fixing member further comprises a fixing member fixing hole, and the screw passes through the fixing member fixing hole.

6. The connector assembling structure as claimed in claim 1, further comprising another circuit board, wherein the connector comprises an inclined surface and the another circuit board comprises a guidance inclined surface corresponding to the inclined surface, the another circuit board is guided by the inclined surface and the guidance inclined surface.

7. The connector assembling structure as claimed in claim 1, wherein the elastic member further comprises a spring abutting the fixing member.

8. The connector assembling structure as claimed in claim 1, wherein a profile of the elastic member is rhombus or rectangular.

9. A connector assembling structure, comprising:
a shell;
a circuit board disposed on the shell;
a connector disposed on the circuit board;
a fixing member fixed on the shell;
an elastic member disposed on the fixing member; and
a screw;
wherein the fixing member further comprises a fixing member fixing hole, and the screw passes through the fixing member fixing hole;
wherein the circuit board comprises a pillar, the fixing member comprises a fixing member opening corresponding to the pillar, the pillar passes through the fixing member opening, and a size of the fixing member opening is greater than a size of the pillar.

10. The connector assembling structure as claimed in claim 9, further comprising a positioning member disposed on the shell, wherein the fixing member comprises a fixing member positioning hole, and the positioning member passes through the fixing member positioning hole.

11. The connector assembling structure as claimed in claim 10, wherein a size of the fixing member positioning hole is less than a size of the fixing member opening.

12. The connector assembling structure as claimed in claim 9, further comprising a pad disposed between the circuit board and the fixing member.

13. The connector assembling structure as claimed in claim 9, wherein the elastic member further comprises an elastic member opening corresponding to the pillar, and the screw passes through the elastic member opening.

14. The connector assembling structure as claimed in claim 9, further comprising another circuit board, wherein the connector comprises an inclined surface and the another circuit board comprises a guidance inclined surface corresponding to the inclined surface, the another circuit board is guided by the inclined surface and the guidance inclined surface.

15. The connector assembling structure as claimed in claim 9, wherein the elastic member further comprises a spring abutting the fixing member.

16. The connector assembling structure as claimed in claim 9, wherein a profile of the elastic member is rhombus or rectangular.

17. A connector assembling structure, comprising:
a shell;
a circuit board disposed on the shell;
a connector disposed on the circuit board;
a fixing member fixed on the shell; and
an elastic member disposed on the fixing member;
wherein the circuit board comprises a pillar, the fixing member comprises a fixing member opening corresponding to the pillar, the pillar passes through the fixing member opening, and a size of the fixing member opening is greater than a size of the pillar;
wherein a profile of the elastic member is rhombus or rectangular.

18. The connector assembling structure as claimed in claim 17, further comprising a positioning member disposed on the shell, wherein the fixing member comprises a fixing member positioning hole, and the positioning member passes through the fixing member positioning hole.

19. The connector assembling structure as claimed in claim 18, wherein a size of the fixing member positioning hole is less than a size of the fixing member opening.

20. The connector assembling structure as claimed in claim 17, further comprising another circuit board, wherein the connector comprises an inclined surface and the another circuit board comprises a guidance inclined surface corresponding to the inclined surface, the another circuit board is guided by the inclined surface and the guidance inclined surface.

* * * * *